(12) United States Patent
Ishizaki et al.

(10) Patent No.: US 7,319,318 B2
(45) Date of Patent: Jan. 15, 2008

(54) MAGNETIC SENSOR

(75) Inventors: Yoichi Ishizaki, Aichi (JP); Katsuya Kogiso, Aichi (JP)

(73) Assignee: Kabushiki Kaisha Tokai Rika Denki Seisakusha, Aichi (JP)

( * ) Notice: Subject to any disclaimer, the term of this patent is extended or adjusted under 35 U.S.C. 154(b) by 130 days.

(21) Appl. No.: 11/136,599

(22) Filed: May 24, 2005

(65) Prior Publication Data

US 2005/0264281 A1  Dec. 1, 2005

(30) Foreign Application Priority Data

May 25, 2004  (JP) .............................. 2004-155090

(51) Int. Cl.
*G01R 33/02*  (2006.01)
(52) U.S. Cl. .................. 324/207.21; 324/252
(58) Field of Classification Search ........... 324/207.21, 324/252
See application file for complete search history.

(56) References Cited

U.S. PATENT DOCUMENTS 6,194,896 B1 * 2/2001 Takahashi et al. .......... 324/252
6,329,818 B1 * 12/2001 Tokunaga et al. .......... 324/252

FOREIGN PATENT DOCUMENTS

JP  05-034224  2/1993

* cited by examiner

*Primary Examiner*—Reena Aurora
(74) *Attorney, Agent, or Firm*—Patterson, Thuente, Skaar & Christensen, P.A.

(57) ABSTRACT

A magnetic sensor that prevents offset voltage from changing as time elapses. The magnetic sensor detects change in the direction of the magnetic field when the electric resistances of magnetic resistors change. The magnetic resistors of the magnetic sensor each include a heat treatment section formed by performing a pre-trimming heat treatment.

14 Claims, 6 Drawing Sheets

MAGNETIC SENSOR

CROSS-REFERENCE TO RELATED APPLICATIONS

This application is based upon and claims the benefit of priority from prior Japanese Patent Application No. 2004-155090, filed on May 25, 2004, the entire contents of which are incorporated herein by reference.

BACKGROUND OF THE INVENTION

The present invention relates to a magnetic sensor for detecting the steering angle of a steering wheel.

Figure 1:
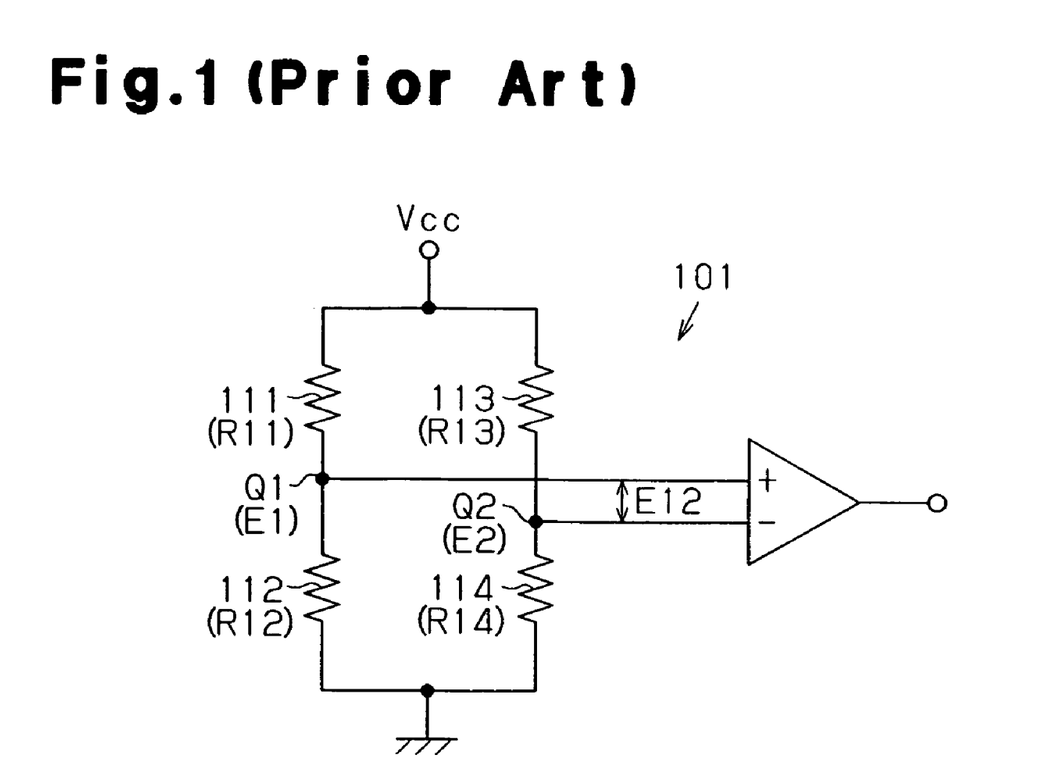
FIG. 1 is an electric circuit diagram of a magnetic sensor in the prior art.

Referring to FIG. 1, a prior art magnetic sensor 101 includes four magnetic resistors 111 to 114, which configure a Wheatstone bridge. When a preferred or high performance magnetic sensor is arranged in an electric field of a predetermined direction, the voltage difference of a node Q1, between the magnetic resistors 111 and 112, and a node Q2, between the magnetic resistors 113 and 114, is close to zero volts. The voltage difference is an offset voltage, which is the difference between median potentials E1 and E2 of the bridge. When the electric resistances of the magnetic resistors 111, 112, 113, and 114 are respectively represented by R11, R12, R13, and R14, the preferred or high performance magnetic sensor satisfies equation (1).

$$R11 \times R14 = R12 \times R13 \quad (1)$$

Figure 2:
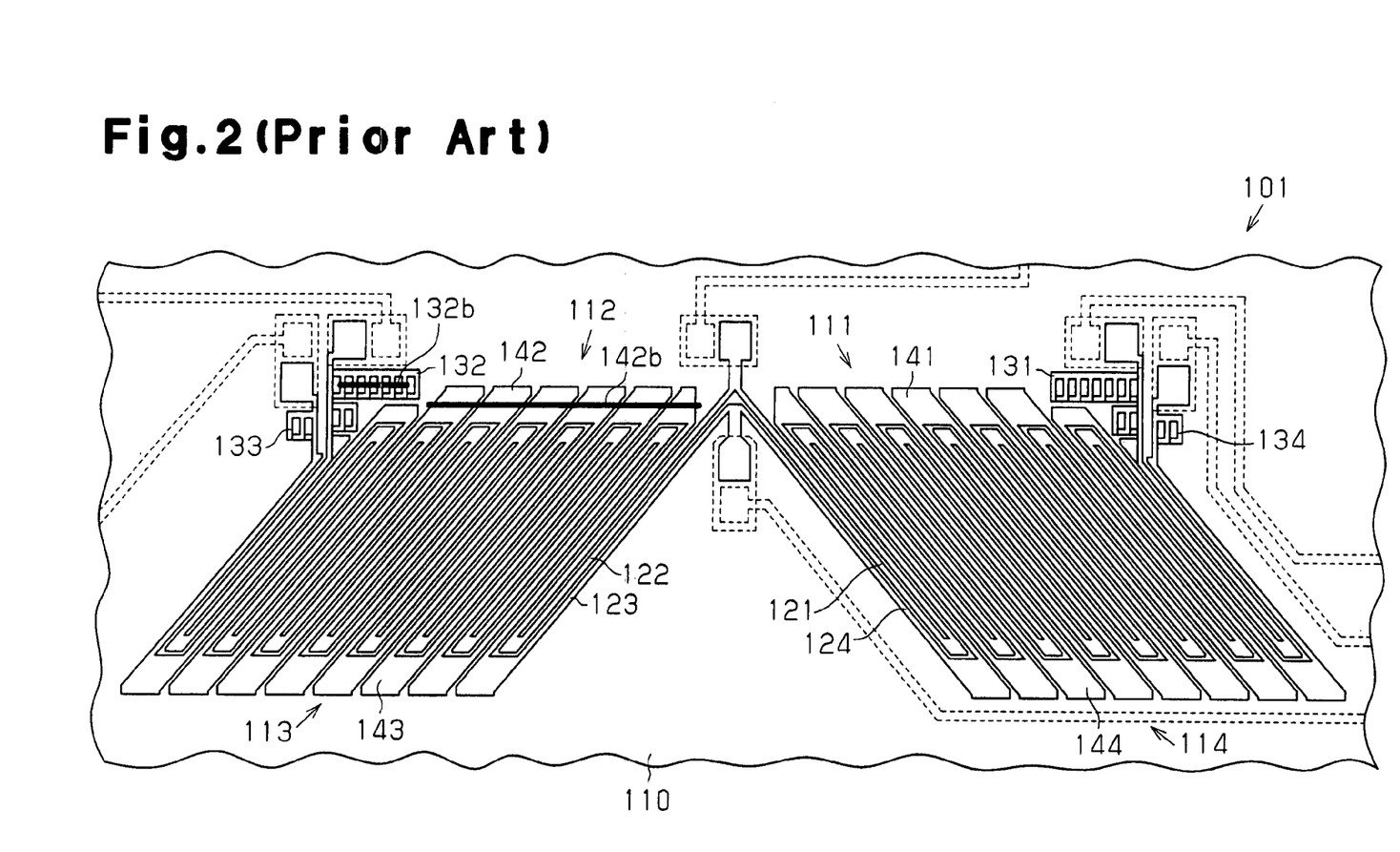
FIG. 2 is a schematic diagram showing four magnetic resistors included in the prior art magnetic sensor.

FIG. 2 is an enlarged diagram showing the four magnetic resistors 111 to 114. Each of the magnetic resistors 111 to 114 is a thin film having a certain pattern and is formed on a substrate 110 of the magnetic sensor 101. The magnetic resistor 111 includes a magnetic detection portion 121, a rough adjustment portion 131, and a fine adjustment portion 141. The magnetic detection portion 121 is extremely narrow. The rough adjustment portion 131 is narrow and ladder-like. The fine adjustment portion 141 is extremely wide. The other magnetic resistors 112, 113, and 114 each have the same configuration as the magnetic resistor 111 and respectively include magnetic detection portions 122, 123, and 124, rough adjustment portions 132, 133, and 134, and fine adjustment portions 142, 143, and 144.

The procedures for manufacturing the prior art magnetic sensor 101 will now be described. In the magnetic sensor 101, the patterns of the magnetic resistors 111 to 114 are determined so as to equalize the electric resistances R11 to R14. When the electric resistances R11 to R14 are equal to one another, the offset voltage E12 is close to zero volts, and equation (1) is satisfied. However, the electric resistances R11 to R14 tend to differ from each other. Factors causing such differences include the formation accuracy of thin films and the etching accuracy for patterning the magnetic resistors 111 to 114. However, even if the thin film formation accuracy and etching accuracy for patterning the magnetic resistors 111 to 114 were to be improved, it would still be difficult to satisfy equation (1).

Japanese Laid-Open Patent Publication No. 05-034224 proposes laser trimming in which the magnetic resistors 111 to 114 are partially cut with a laser beam to finely adjust the electric resistances R11 to R14.

The laser trimming partially cuts one of the four magnetic resistors 111 to 114. This increases the resistance of the partially cut magnetic resistor and satisfies equation (1).

Figure 3:
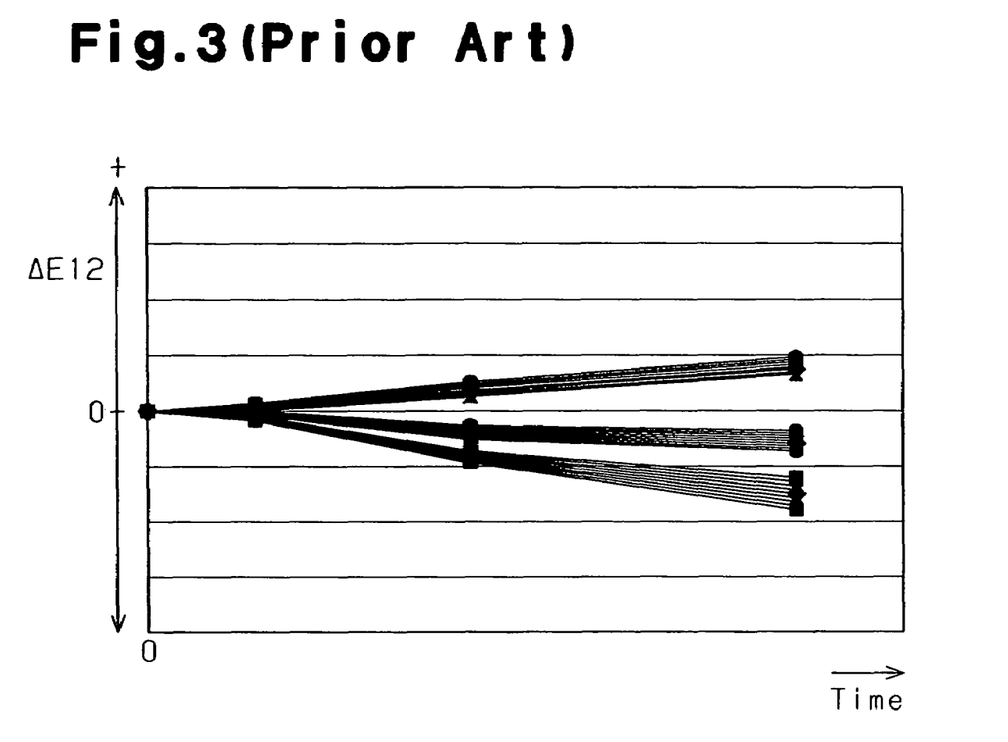
FIG. 3 is a graph showing chronological changes in the offset voltage of the prior art magnetic sensor.

The laser trimming performed in the prior art will now be described with reference to FIG. 2. Laser trimming is performed to cut part of the rough adjustment portion 132 (trimming section 132b) and part of the fine adjustment portion 142 (trimming section 142b). The magnetic resistor 112 receives the heat generated by irradiation of the laser beam. The magnetic resistors 111, 113, and 114 do not receive the heat of the laser beam irradiation. Change in the electric resistances R11 and R14 subsequent to laser trimming differs between the magnetic resistor 112, which is irradiated with a laser beam, and the magnetic resistors 111, 113, and 114, which are not irradiated with a laser beam. Thus, even when performing the laser trimming to satisfy equation (1), the electric resistance R12 of the magnetic resistor 112 changes at a rate that differs from the rate at which the electric resistances R11, R13, and R14 of the magnetic resistors 111, 113, and 114 change as time elapses. Thus, the equilibrium of the Wheatstone bridge (equation 1) cannot be maintained as time elapses. Thus, the offset voltage E12 changes from zero volts, immediately after the laser trimming, to a level that cannot be ignored in regard with the capacity of the magnetic sensor 101 (refer to FIG. 3).

SUMMARY OF THE INVENTION

It is an object of the present invention to provide a magnetic sensor that prevents the offset voltage from changing as time elapses.

One aspect of the present invention is a magnetic sensor for detecting change in magnetism. The magnetic sensor includes a plurality of magnetic resistors, each having an electric resistance that changes in accordance with change in magnetism. A plurality of heat treatment sections are fused by heat and respectively arranged in association with the magnetic resistors.

Another aspect of the present invention is a magnetic sensor for detecting change in magnetism. The magnetic sensor includes a plurality of magnetic resistors, each having an electric resistance that changes in accordance with change in magnetism. Each magnetic resistor has at least one of fused points.

Further aspect of the present invention is a method for manufacturing a magnetic sensor that detects change in magnetism. The method includes preparing a substrate and forming a plurality of magnetic resistors, each having a predetermined pattern, on the substrate, performing pre-trimming heat treatment to form a plurality of fused points so that each magnetic resistor has at least one of the fused points, and trimming at least a selected one of the magnetic resistors after the pre-trimming heat treatment to adjust the electric resistances of the magnetic resistors.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

A magnetic sensor 1 according to a preferred embodiment of the present invention will now be described.

Figure 4:
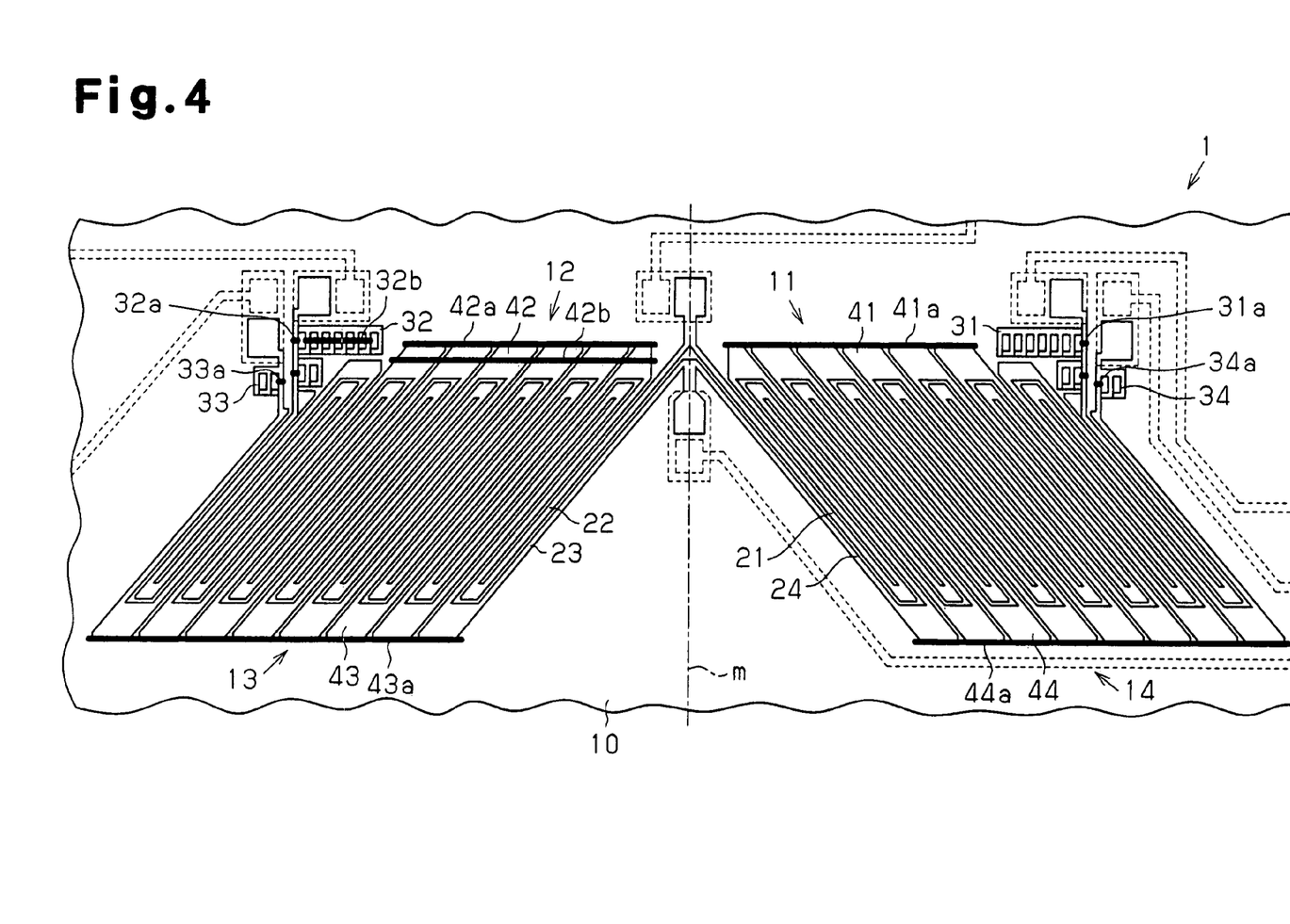
FIG. 4 is a schematic diagram showing four magnetic resistors included in a magnetic sensor according to a preferred embodiment of the present invention.
Figure 5:
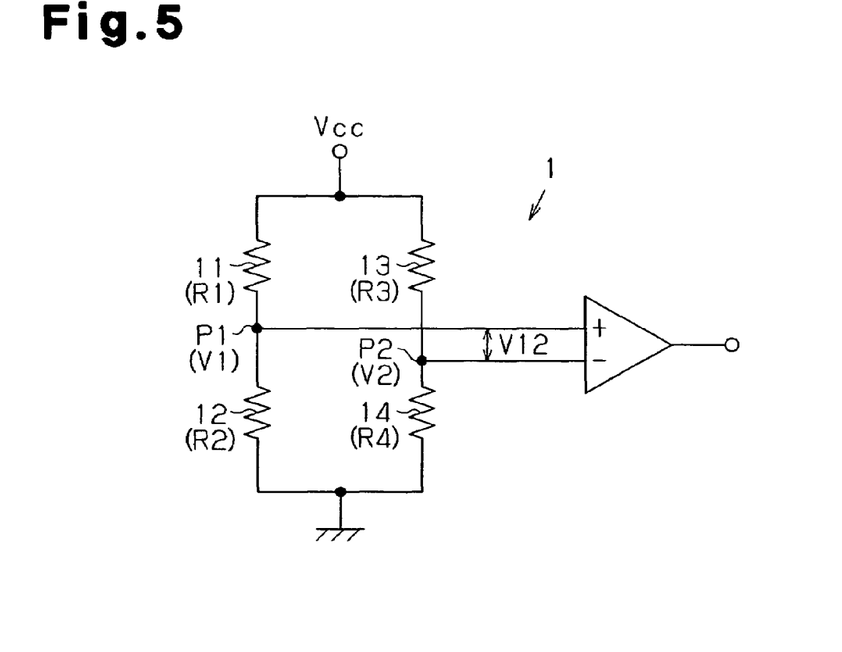
FIG. 5 is an electric circuit diagram of the magnetic sensor shown in FIG. 4.

Referring to FIGS. 4 and 5, the difference between the magnetic sensor 1 of the preferred embodiment and the magnetic sensor 101 of the prior art is that in addition to the section that is trimmed and cut to have the offset voltage approach 0 volts, there is a section that is heated and cut prior to trimming.

The structure of the magnetic sensor 1 will now be described. The magnetic sensor 1 may be used as an angle sensor for detecting the steering angle of an automobile steering wheel.

Referring to FIG. 5, the magnetic sensor 1 includes four magnetic resistors 11 to 14, which configure a Wheatstone bridge. The magnetic resistors 11 to 14 are trimmed so that the difference between potential V1 at node P1 and potential V2 at node P2 (offset voltage V12) is substantially zero volts when the magnetic sensor 1 is arranged in a magnetic field of a predetermined direction. That is, when the electric resistances of the magnetic resistors 11, 12, 13, and 14 are respectively represented by R1, R2, R3, and R4, the magnetic resistors 11, 12, 13, and 14 are partially trimmed to satisfy equation (2).

$$R1 \times R4 = R2 \times R3 \tag{1}$$

Referring to FIG. 4, the magnetic resistors 11 to 14 are thin films having a predetermined pattern and are formed on a substrate 10 of the magnetic sensor 1. The substrate 10 may be made of glass. The magnetic resistors 11 to 14 may each be made of a nickel-cobalt alloy. A nickel-cobalt alloy is a ferromagnetic material having a negative magnetic characteristic in which the electric resistance decreases as changes in the direction of the magnetic field increases.

The magnetic resistors 11 to 14 form two groups. Each group includes two electrically opposed magnetic resistors. More specifically, the first group is formed by the magnetic resistors 11 and 14. The second group is formed by the magnetic resistors 12 and 13. The structure (arrangement) of the first group is symmetric (axisymmetric) to that of the second group with respect to a hypothetical line m.

The magnetic resistor 11 includes a magnetic detection portion 21, a rough adjustment portion 31, and a fine adjustment portion 41. The electric resistance of the magnetic detection portion 21 changes (increases or decreases) in accordance with the level of change in the direction of the magnetic field. The magnetic detection portion 21 is extremely narrow. The rough adjustment portion 31 is narrow and ladder-like. The fine adjustment portion 41 is extremely wide. The rough adjustment portion 31 is partially trimmed and cut to greatly change the electric resistance R1 of the magnetic resistor 11. In other words, the rough adjustment portion 31 is trimmed to roughly increase the electric resistance R1 of the magnetic resistor 11. The fine adjustment portion 41 is partially trimmed and cut to finely change the electric resistance R1 of the magnetic resistor 11. In other words, the fine adjustment portion 41 is trimmed to finely increase the electric resistance R1 of the magnetic resistor 11.

The magnetic resistors 12, 13, and 14 each have the same configuration as the magnetic resistor 111. Further, the magnetic resistors 12, 13, and 14 respectively include magnetic detection portions 22, 23, and 24, rough adjustment portions 32, 33, and 34, and fine adjustment portions 42, 43, and 44.

The features of the magnetic sensor 1 will now be described.

The magnetic sensor 1 includes a heat treatment section (fused point) that undergoes heat treatment prior to trimming. Every one of the magnetic resistors 11 to 14 includes at least one heat treatment section. In one embodiment, every one of the magnetic resistors 11 to 14 includes two heat treatment sections.

More specifically, the rough adjustment portion 31 of the magnetic resistor 11 includes a heat treatment section 31a that is thermally fused. In the same manner, the rough adjustment portions 32, 33, and 34 of the remaining magnetic resistors 12, 13, and 14 respectively include heat treatment sections 32a, 33a, and 34a. That is, each of the rough adjustment portions 31 to 34 in the magnetic sensor 1 includes at least one heat treatment section 31a, 32a, 33a, and 34a, respectively.

The fine adjustment portion 41 of the magnetic resistor 11 includes a thermally fused heat treatment section 41a. In the same manner, the fine adjustment portions 42, 43, and 44 of the remaining magnetic resistors 12, 13, and 14 respectively include heat treatment sections 42a, 43a, and 44a. That is, each of the fine adjustment portions 41 to 44 in the magnetic sensor 1 includes at least one heat treatment section 41a, 42a, 43a, and 44a, respectively.

The procedure for manufacturing the magnetic sensor 1 of the preferred embodiment will now be described.

The patterns of the magnetic resistors 11 to 14 are each determined so that the electric resistances R1 to R4 are equalized in a manner that the offset voltage V12 of the magnetic sensor 1 approaches zero volts (satisfies equation (2)) without performing trimming.

The surface of the substrate 10 is sputtered in accordance with the pattern to form the films of the magnetic resistors 11 to 14.

Film formation and photolithography are repeated to pattern the magnetic resistors 11 to 14. Then, a pre-trimming heat treatment is conducted on all of the magnetic resistors 11 to 14. In the pre-trimming heat treatment, the magnetic resistors 11 to 14 are each irradiated with a laser beam to form the heat treatment sections 31a to 34a and 41a to 44a. In the preferred embodiment, each of the rough adjustment portions 31 to 34 and each of the fine adjustment portions 41 to 44 are irradiated with a laser beam. This forms the heat treatment sections 31a to 34a and 41a to 44a, which have been fused by the heat of the laser beam.

Subsequent to the pre-trimming heat treatment, trimming is performed if necessary. When trimming is performed, selected ones of the magnetic resistors 11 to 14 are partially irradiated with a laser beam to cut part of the selected magnetic resistors 11 to 14. This cutting finely adjusts the electric resistances R1 to R4.

An example for finely adjusting the electric resistance R2 by partially cutting the magnetic resistor 12 through the irradiation of a laser beam to satisfy equation (2) will now be described. When performing trimming, the rough adjustment portion 32 (trimming section 32b) is irradiated with a laser beam and cut to roughly increase the electric resistance R2 of the magnetic resistor 12. Then, the fine adjustment portion 42 (trimming section 42b) is irradiated with a laser beam and cut to finely increase the electric resistance R2 of the magnetic resistor 12. Immediately after laser beam trimming, the offset voltage V12 is adjusted to approximately zero volts.

The operation of the magnetic sensor 1 will now be described.

When the heat treatment sections 31a to 34a and 41a to 44a are formed, each of the magnetic resistors 11 to 14 included in the magnetic sensor 1 receives heat. The heat affects the electric resistances R1 to R4 in the same manner in all of the magnetic resistors 11 to 14.

After the heat treatment sections 31a to 34a and 41a to 44a are formed in the magnetic resistors 11 to 14, trimming is performed on a selected one of the magnetic resistors (e.g., magnetic resistor 12). In this case, due to the heat generated by the trimming, it may be considered that the electric resistance R2 of the magnetic resistor 12 would change differently from the electric resistances of the other magnetic resistors and thereby cause the offset voltage V12 to change. However, the magnetic resistors 11 to 14 have all received heat prior to trimming during formation of the heat treatment sections 31a to 34a and 41a to 44a. Thus, at this point, the electric resistances R1 to R4 of the magnetic resistors 11 to 14 are thermally stabilized regardless of the application of the trimming heat.

Figure 6:
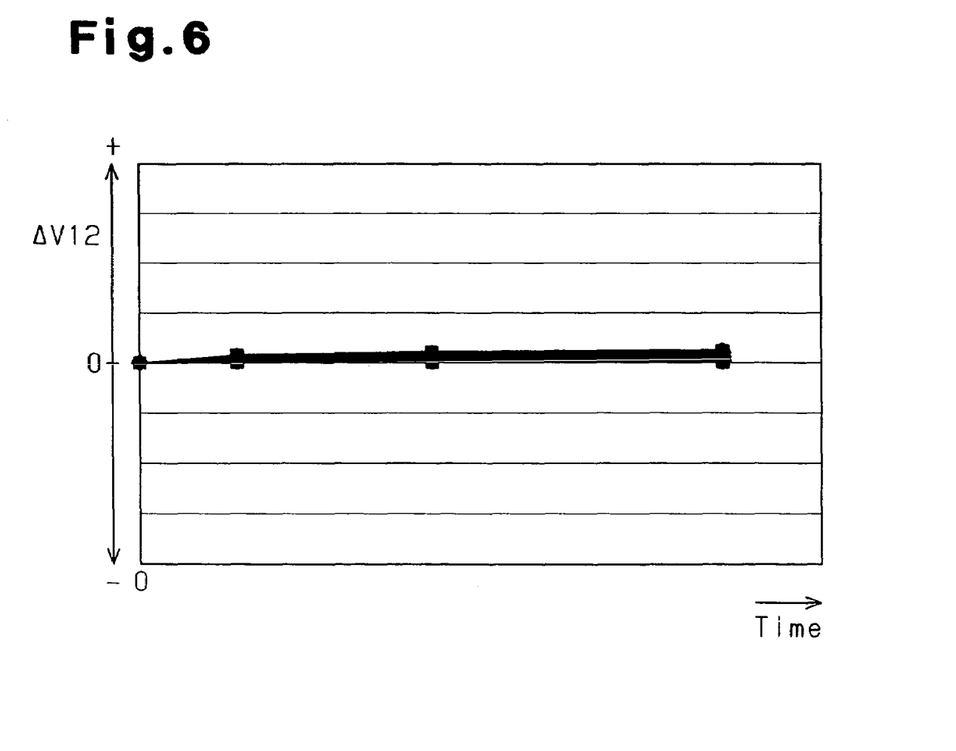
FIG. 6 is a graph showing chronological changes in the offset voltage of the magnetic sensor shown in FIG. 4.

The difference between change in the electric resistance R12 of the trimmed magnetic resistance 12, which is affected by the trimming heat, and change in the electric resistances R12, R13, and R14 of the other magnetic resistors 11, 13, and 14, which are not trimmed, is small in comparison with the magnetic sensor of the prior art that does not undergo a pre-trimming heat treatment. Accordingly, even when a relatively long time elapses from when trimming is performed, the Wheatstone equilibrium is maintained. Thus, the offset voltage V12, which is zero volts immediately after the laser trimming, remains at about the same level (refer to FIG. 6).

The preferred embodiment has the advantages described below.

(1) The magnetic resistors 11 to 14 of the magnetic sensor 1 respectively include the heat treatment sections 31a to 34a and 41a to 44a. That is, when the magnetic sensor 1 is manufactured, the heat treatment sections 31a to 34a and 41a to 44a are formed during the pre-trimming heat treatment, which is performed before trimming. The pre-trimming heat treatment stabilizes the electric resistances R1 to R4 of the magnetic resistors 11 to 14.

Since the pre-trimming heat treatment is performed on all of the magnetic resistors 12 to 14, even when subsequently trimming a selected one of the magnetic resistors (e.g., magnetic resistors 12), the difference between change in the electric resistance of the trimmed magnetic resistor 12, which changes due to the trimming heat, and change in the electric resistance of the non-trimmed magnetic resistors 11, 13, and 14 is relatively small. This difference is smaller than that of the prior art magnetic sensor, which does not undergo the pre-trimming heat treatment. This prevents the offset voltage V12 from changing as time elapses.

(2) The magnetic sensor 1 includes the rough adjustment portions 31 to 34, which greatly change the electric resistances R1 to R4 when cut. All of the rough adjustment portions 31 to 34 include the heat treatment sections 31a to 34a, which are formed during the pre-trimming heat treatment. The application of heat to part of every one of the rough adjustment portions 31 to 34 stabilizes the electric resistances R1 to R4 of the magnetic resistors 11 to 14. This prevents the offset voltage V12 from changing as time elapses.

(3) All of the rough adjustment portions 31 to 34 respectively include the heat treatment sections 31a to 34a, and all of the fine adjustment portions 41 to 44 include the heat treatment sections 41a to 44a. Thus, the application of heat, prior to trimming, to all of the rough adjustment portions 31 to 34 and the fine adjustment portions 41 to 44 that may be trimmed stabilizes the electric resistances R1 to R4 of the magnetic resistors 11 to 14. This prevents the offset voltage V12 from changing as time elapses in a further preferable manner.

(4) The magnetic resistors 11 to 14 respectively include the heat treatment sections 31a to 34a and 41a to 44a, which are formed in the pre-trimming heat treatment. The heat of the pre-trimming heat treatment is directly transmitted to the magnetic resistors 11 to 14 from the heat treatment sections 31a to 34a and 41a to 44a. The electric resistances R1 to R4 of the magnetic resistors 11 to 14 are stabilized before trimming is performed. Thus, the offset voltage V12 substantially remains at its initial value even when trimming is performed.

(5) Even when trimming does not have to be performed to adjust the electric resistances R1 to R4, the pre-trimming heat treatment stabilizes the resistances of the magnetic resistors 11 to 14. Thus, the resistances change uniformly. This prevents the offset voltage V12 from changing as time elapses in a further preferable manner.

It should be apparent to those skilled in the art that the present invention may be embodied in many other specific forms without departing from the spirit or scope of the invention. Particularly, it should be understood that the present invention may be embodied in the following forms.

The heat treatment sections do not have to be formed in the magnetic resistors 11 to 14 and may be formed at a location separated from the magnetic resistors 11 to 14. That is, the heat treatment sections may be independent from the magnetic resistors 11 to 14 or may be electrically disconnected from the magnetic resistors. This would also prevent the offset voltage V12 from changing as time elapses. In this case, since the magnetic resistors 11 to 14 are independent from the heat treatment sections, the heat generated during the pre-trimming heat treatment would be indirectly transmitted from the heat treatment sections to the magnetic resistors 11 to 14. This would prevent the electric resistances R1 to R4 of the magnetic resistors 11 to 14 from being significantly increased by the heat generated during the pre-trimming heat treatment.

When forming heat treatment sections at locations separated from the magnetic resistors 11 to 14, it is preferred that the heat treatment sections be located near the magnetic resistors 11 to 14 to apply the heat required to stabilize the electric resistances R1 to R4 within a short period of time.

The heat treatment sections may be dummy portions separated from the magnetic resistors 11 to 14 and formed from the same material as the magnetic resistors 11 to 14. The dummy portions are formed during the film formation process. During the pre-trimming heat treatment, heat is applied to the dummy sections to fuse the dummy sections.

Figure 7:
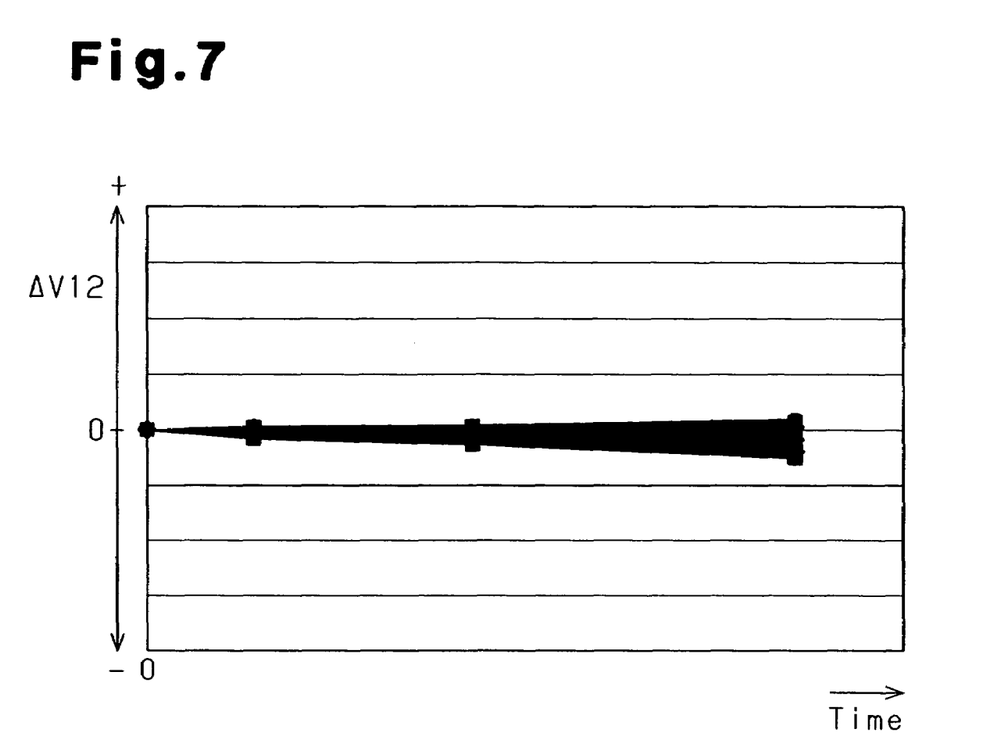
FIG. 7 is a graph showing chronological changes in the offset voltage of a magnetic sensor according to a further embodiment of the present invention.

The heat treatment sections 41a to 44a of the fine adjustment portions 41 to 44 may be eliminated. FIG. 7 is a graph showing chronological changes in the offset voltage V12 of a magnetic sensor that includes fine adjustment portions 41 to 44, without the heat treatment sections 41a to 44a, and rough adjustment portions 31 to 34, with the heat treatment sections 31a to 34a. Chronological change in the offset voltage V12 is relatively small.

It is preferred that the heat treatment section not be arranged in the magnetic detection portions 21 to 24, which detect changes in the direction of the magnetic field.

It is preferred that heat be locally applied during the pre-trimming heat treatment that forms the heat treatment sections 31a to 34a and 41a to 44a.

It is preferred that heat be applied in a short period of time (e.g., 0.5 seconds, which is less than one second) during the pre-trimming heat treatment that forms the heat treatment sections 31a to 34a and 41a to 44a.

It is preferred that heat be applied at a high temperature (e.g., 1,500 degrees centigrade, which is greater than 1,000 degrees centigrade) during the pre-trimming heat treatment that forms the heat treatment sections 31a to 34a and 41a to 44a.

The magnetic resistors 11 to 14 may be made from a ferromagnetic material having a negative magnetic characteristic such as Permalloy.

The material forming the magnetic resistors 11 to 14 is not limited to a ferromagnetic material having a negative magnetic characteristic. That is, the material forming the magnetic resistors 11 to 14 may be a semiconductor having a positive magnetic characteristic in which the electric resistance increases as the change in the direction of the magnetic field increases. Semiconductors having such positive magnetic characteristic include indium antimonide (InSb) alloys and gallium arsenide (GaAr) alloys.

The present examples and embodiments are to be considered as illustrative and not restrictive, and the invention is not to be limited to the details given herein, but may be modified within the scope and equivalence of the appended claims.

What is claimed is:

1. A magnetic sensor for detecting change in magnetism, the magnetic sensor conprising:
   a plurality of magnetic resistors, each including at least one magnetic detection portion having an electric resistance that changes in accordance with change in magnetism; and
   a plurality of heat treatment sections fused by heat and respectively arranged in association with the magnetic resistors, wherein the plurality of heat treatment sections are arranged at the plurality of magnetic resistors at locations other than the magnetic detection portions.

2. The magnetic sensor according to claim 1, wherein each of the magnetic resistors includes a rough adjustment portion that is trimmed to roughly increase the electric resistance of the magnetic resistor, and each of the heat treatment sections is associated with the corresponding rough adjustment portion.

3. The magnetic sensor according to claim 2, wherein each of the magnetic resistors includes a fine adjustment portion that is trimmed and cut to finely increase the electric resistance of the magnetic resistor, and each of the heat treatment sections is arranged in the corresponding fine adjustment portion.

4. The magnetic sensor according to claim 1, wherein the heat treatment sections are part of the magnetic resistors.

5. The magnetic sensor according to claim 1, wherein the heat treatment sections are arranged independently from the magnetic resistors.

6. The magnetic sensor according to claim 1, wherein each of the magnetic resistors is made of a ferromagnetic material having a negative magnetic characteristics in which the electric resistance decreases as change in magnetism increases.

7. The magnetic sensor according to claim 6, wherein each of the magnetic resistors is made of a nickel-cobalt alloy.

8. A magnetic sensor for detecting change in magnetism, the magnetic sensor comprising:
   a plurality of magnetic resistors, each including at least one magnetic detection portion having an electric resistance that changes in accordance with change in magnetism; and
   a plurality of fused points formed in the magnetic resistors, each magnetic resistor having at least one of the fused points, wberein the plurality of fused points are arranged at the plurality of magnetic resistors at locations other than the magnetic detection portion.

9. The magnetic sensor according to claim 8, wherein each of the magnetic resistors includes a rough adjustment portion that is partially trimmed to roughly increase the electric resistance of the magnetic resistor, corresponding rough adjustment portion.

10. The magnetic sensor according to claim 9, wherein each of the magnetic resistors includes a fine adjustment portion that is partially trimmed and cut to finely increase the electric resistance of the magnetic resistor, and each of the fused points is arranged in the corresponding fine adjustment portion.

11. The magnetic sensor according to claim 8, wherein each of the magnetic resistors is made of a ferromagnetic material having a negative magnetic characteristic in which the electric resistance decreases as change in magnetism increases.

12. The magnetic sensor according to claim 11, wherein each of the magnetic resistors is made of a nickel-cobalt alloy.

13. The magnetic sensor according to claim 8, wherein the plurality of magnetic resistors are four magnetic resistors configuring a Wheatstone bridge.

14. The magnetic sensor according to claim 8, wherein the electric resistances of all of the magnetic resistors are thermally stabilized.

* * * * *

UNITED STATES PATENT AND TRADEMARK OFFICE
CERTIFICATE OF CORRECTION

PATENT NO. : 7,319,318 B2  Page 1 of 1
APPLICATION NO. : 11/136599
DATED : January 15, 2008
INVENTOR(S) : Yoichi Ishizaki et al.

It is certified that error appears in the above-identified patent and that said Letters Patent is hereby corrected as shown below:

On the title page, item (73) Assignee:

Please delete "SEISAKUSHA" and insert --SEISAKUSHO--.

Signed and Sealed this

Third Day of June, 2008

JON W. DUDAS
*Director of the United States Patent and Trademark Office*